United States Patent [19]

Hirai et al.

[11] Patent Number: 5,608,488
[45] Date of Patent: Mar. 4, 1997

[54] DATA PROCESSING DEVICE FOR A CAMERA

[75] Inventors: Toshiaki Hirai; Atsushi Takami; Shinichi Endo; Yoshihisa Kurosawa, all of Yotsukaido, Japan

[73] Assignee: Seiko Precision Inc., Tokyo, Japan

[21] Appl. No.: 358,711

[22] Filed: Dec. 19, 1994

[30] Foreign Application Priority Data

Dec. 21, 1993 [JP] Japan ..................... 5-322320

[51] Int. Cl.$^6$ .............. G03B 17/00; G06F 11/00
[52] U.S. Cl. ............. 396/125; 371/21.2; 396/147
[58] Field of Search .................. 354/432, 412, 354/403; 371/21.1, 21.2, 30, 31; 364/944

[56] References Cited

U.S. PATENT DOCUMENTS 3,544,777  12/1970  Winkler ..................... 371/21.2
4,404,647  9/1983   Jones et al. ................. 364/944 X
4,937,831  6/1990   Aoyama et al. .............. 371/21.2 X

FOREIGN PATENT DOCUMENTS 220533  9/1991  Japan .

Primary Examiner—W. B. Perkey
Attorney, Agent, or Firm—Amster, Rothstein & Ebenstein

[57] ABSTRACT

A data processing device for a camera wherein a parity bit is provided in data of an EEPROM, and when a parity error is caused by destruction of data or the like, data previously prepared in a ROM is employed, or when data before and after a specific abnormal data are normal, an interpolation calculation is performed by using these normal data. When data memorized in the EEPROM are destructed by an unexpected accident such as by static electricity, the data are prevented from using and picture taking can be continued without applying a serious influence on the picture-taking operation by performing an approximation calculation by using the other normal data memorized in the ROM.

7 Claims, 5 Drawing Sheets

| ADDRESS | BIT | | | |
|---|---|---|---|---|
| | 31 | 30 —— 16 | 15 —— 1 | 0 |
| 1 | $P_{Y1}$ | $Y_1$ | $X_1$ | $P_{X1}$ |
| 2 | $P_{Y2}$ | $Y_2$ | $X_2$ | $P_{X2}$ |
| 3 | $P_{Y3}$ | $Y_3$ | $X_3$ | $P_{X3}$ |
| 4 | $P_{Y4}$ | $Y_4$ | $X_4$ | $P_{X4}$ |
| 5 | $P_{Y5}$ | $Y_5$ | $X_5$ | $P_{X5}$ |
| 6 | $P_{Y6}$ | $Y_6$ | $X_6$ | $P_{X6}$ |
| 7 | $P_{Y7}$ | $Y_7$ | $X_7$ | $P_{X7}$ |
| ⋮ | ⋮ | ⋮ | ⋮ | ⋮ |

I { 1, 2, 3 }
II { 4, 5 }
III { 6, 7 }

FIG. 2

| LR | D (m) |
|---|---|
| 1 | 23.0 |
| 2 | 11.5 |
| 3 | 7.7 |
| 4 | 5.7 |
| 5 | 4.6 |
| 6 | 3.8 |
| ⋮ | ⋮ |

FIG. 3

DATA PROCESSING DEVICE FOR A CAMERA

BACKGROUND OF THE INVENTION

1. Field of the Invention

The present invention relates to a data processing device for a camera.

2. Discussion of Background

As is disclosed in Japanese Unexamined Patent Publication No. 220533/1991, a conventional data processing device for a camera determines whether a correction value read from an involatile readable and writable memory (electric erasable programmable read only memory; hereinafter, EEPROM) is in a predetermined area or not, performs a correction calculation by using the correction value when the correction value is in the predetermined area, and regards the correction value as abnormal when it is out of the area, thereby preventing serious disadvantage of a camera based on unjustified writing to the memory or destruction of data.

In the conventional data processing device, when the data read from the EEPROM is determined to be invalid, although the using of the correction value is prohibited and an alarm is issued to a photographer, the processing may be performed without the correction calculation, or a later processing may be discontinued, and therefore, a correct picture taking may not be performed.

SUMMARY OF THE INVENTION

It is an object of the present invention to enable a correct picture taking even when a memorizing means is determined to be invalid.

According to a first aspect of the present invention, there is provided a data processing device for a camera wherein data are predetermined with respect to a measured value inputted from outside which can express an error amount of the measured value by one and other coordinate axes of an orthogonal coordinate axes system and a correct measured value is provided by a correction calculation using the data comprising:

a first memorizing means for dividing the data in a plurality of blocks and memorizing the data;

a second memorizing means for memorizing predetermined values in the respective blocks of the first memorizing means;

a determining means for determining whether second data of one of the blocks related to the data read from the first memorizing means for performing the correction calculation are valid or invalid and for outputting a result of determination; and a calculating means for performing the correction calculation based on the second data of the one of the blocks when the data read from the first memorizing means are determined to be valid from the result of determination and for reading the predetermined value in the block from the second memorizing means when the data read from the first memorizing mean are determined to be invalid and performing the correction calculation based on the predetermined value.

According to a second aspect of the present invention, there is provided a data processing device for a camera wherein a plurality of data are predetermined with respect to a measured value inputted from outside which can express an error amount of the measured value by one and other coordinate axes of an orthogonal coordinate axes system and a correct measured value is provided by a correction calculation using the data comprising:

a first memorizing means for memorizing the plurality of data;

a determining means for determining whether first data read from the first memorizing means for performing the correction calculation are valid or invalid and for outputting a result of determination; and a calculating means for performing the correction calculation by using the first data when the result of determination is determined to be valid and performing the correction calculation by using second data other than the first data read from the first memorizing means when the result of determination on the first data is determined to be invalid.

According to a third aspect of the present invention, there is provided the data processing device for a camera according to the second aspect, wherein at least one of prohibiting of releasing the camera and alarming is performed when the first data a number of which is not less than a predetermined number in the first memorizing means are determined to be invalid by the determining means.

According to the above aspects of the present invention, a parity bit is provided in the data of an EEPROM, and other data which have previously been prepared in a ROM are used, when a parity error is caused by destruction of the data or the like.

Further, when data other than specified abnormal data are normal, an interpolation calculation is performed by using the normal data.

BRIEF DESCRIPTION OF THE DRAWINGS

FIG. 2 is a diagram showing a storage style of data in an EEPROM of the embodiment of the present invention;

FIG. 3 is a distance table in a ROM of the example of the present invention;

DETAILED DESCRIPTION OF THE PREFERRED EMBODIMENTS

An explanation will be given of an example of the present invention as follows in reference to the drawings.

Figure 1:
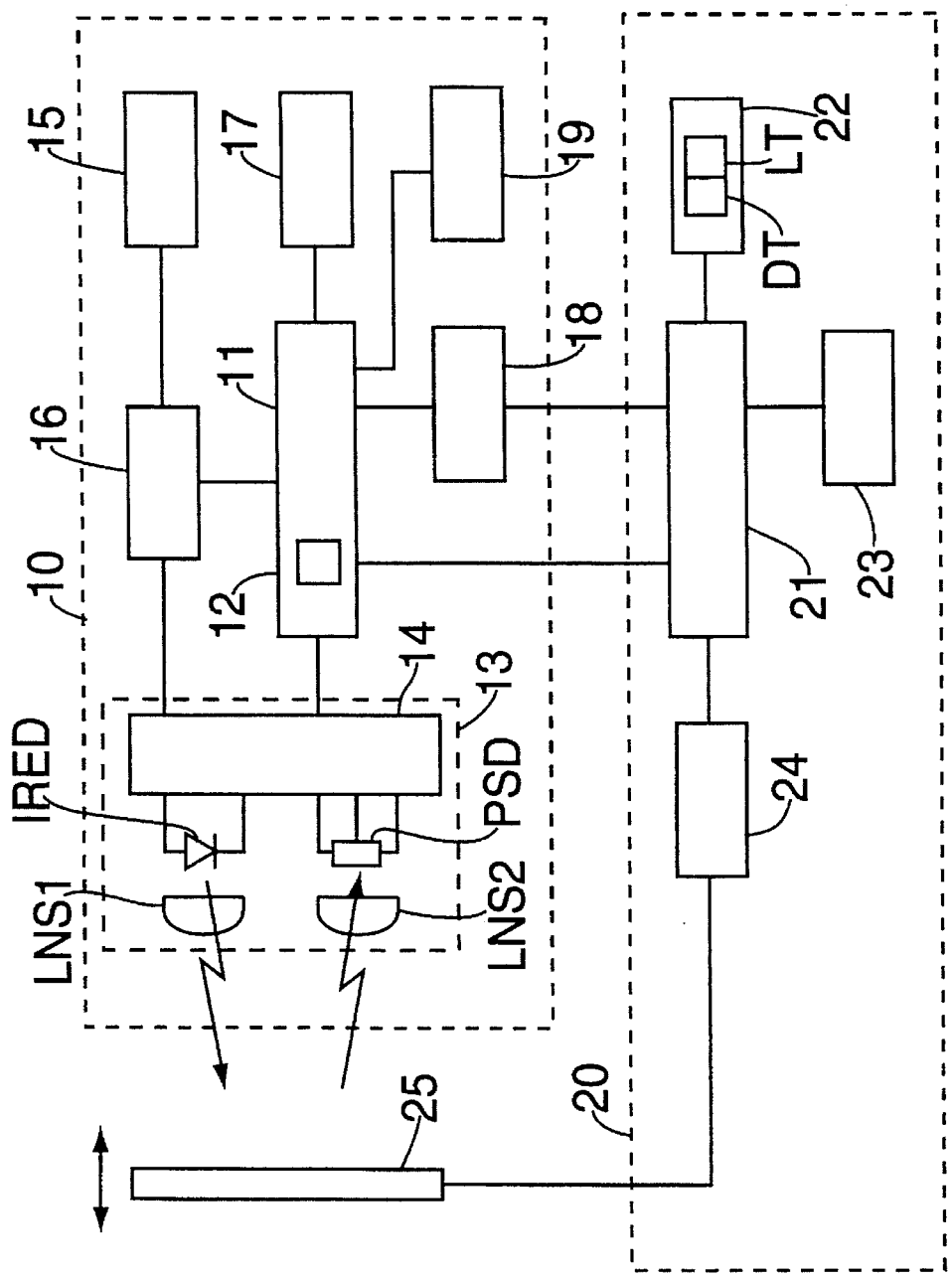
FIG. 1 is a block diagram of an example according to the present invention.

In FIG. 1, a control circuit (hereinafter, CPU) 11 incorporated in a camera 10, performs a supervisory control on the operation of a total of the camera 10 in accordance with various signals inputted from outside and measurement results, which incorporates a readable involatile memory (hereinafter, ROM) 12 retaining programs and reference data (LR1, LR2, ...), mentioned later. A distance measuring means 13 incorporates a distance measuring integrated circuit 14 connected with a light emitting lens LNS1, a light receiving lens LNS2, a light emitting element IRED and a light receiving element PSD, measures a distance up to an object, and outputs a distance signal to an A/D converting circuit 16. A light measuring means 15 measures a brightness, and inputs a brightness signal to the A/D converting circuit 16. The A/D converting circuit 16 converts these signals into digital values and output them to the CPU 11. A driving circuit 17 drives a shutter, not shown, based on an output from the CPU 11. An EEPROM 18 can read and write data in accordance with a control signal of the CPU 11, wherein an actually measured distance value Yi is written which has actually been measured by using a distance sampling point Pi, mentioned later. Further, a characteristic tester 20 comprises a tester CPU 21, a characteristic ROM 22 having a light measuring table LT and a distance table DT, a test data setter 23 and a test circuit 24. The CPU 11 can control the test circuit 24 and drive a plate 25 in accordance with data which have been set by the test data setter 23.

Next, an explanation will be given of a manner of writing data to the EEPROM 18. As shown in FIG. 2, the characteristic ROM 22 of the characteristic tester 20 has a data area which are addressed from 0 to 63 wherein 32 bits compose 1 word. The light measuring table LT and the distance table DT are arranged at predetermined areas in the data area which do not overlap with each other, the respective ones of which are memorized with light measuring design values and distance design values Xi. The adjustment of the light measuring table LT and the distance table DT can selectively be performed from the test data setter 23. In the following, an explanation will be given of a manner of writing the distance table DT for instance.

When the test data setter 23 selects a distance sampling point Pi, a leading address (address 1 in this case) of the distance table DT is selected, the distance design values Xi are written successively from the leading address of the EEPROM 18 in an order proximate to the distance sampling point Pi. Further, distance test data have been set by the test data setter 23, and therefore, the plate 25 at the distance designated by the distance sampling point Pi is operated, the distance measuring means 13 outputs the distance signal up to the plate 25 to the A/D converting circuit 16, and the A/D converting circuit 16 converts it to a digital value and outputs it to the CPU 11. The CPU 11 transmits this value to the tester CPU 21 as an actually measured distance value Yi, and the tester CPU 21 writes the actually measured distance value Yi to the EEPROM. The CPU 11 calculates a relationship between the actually measured distance values Yi (Y1, Y2, . . . ) which have been actually measured at the distance sampling points Pi and distance design values Xi, (X1, X2, . . . ) by the following equation. In equation (1), Yp≦Ya<Yq is always established, and the distance design code Xa shows a distance code.

$$Xa = Xp + (Xq - Xp)(Ya - Yp)/(Yq - Yp) \quad (1)$$

Codes respectively corresponding to the actually measured distance codes (data Y1, Y2, . . . ) are written to the bits 16 through 30 at the respective addresses of the distance table DT and codes respectively corresponding to the distance design codes (data X1, X2, . . . ) are written to the bits 1 through 15 of the respective addresses thereof in an order from near to remote. Further, the bits 31 and the bits 0 of the respective addresses are employed as bits for a publicly known parity check. For instance, in case of an even number parity, when a number of "1" of bits composing data from the bit 1 through the bit 15 is an even number, the bit 0 is written with 0, and the bit 0 is written with 1 when the number is an odd number. Therefore, the total numbers of bits of "1" of the respective ones of the bits 10 through 15 and the bits 16 through 31 become necessarily even numbers. Accordingly, if the total number of the bits of "1" becomes an odd number by some cause, it signifies a parity error.

Next, an explanation will be given of a data correction processing of the example of the present invention. As shown in FIG. 2, the distance table DT is allocated at the addresses from 1 through 7 of the EEPROM 18. The addresses are divided into a plurality of blocks successively wherein the addresses 1 through 3 belong to the block 1 and the addresses 3 through 5 belong to the block 2, and the addresses 5 through 7 belong to the block 3. As shown in FIG. 3, in the respective blocks of the ROM 12, memorized are distance data recommendation distance values LR1 and distance recommendation values at the respective blocks which have been statistically calculated from experiments or the like.

When a publicly known release button, not shown, is pushed on, the distance measuring means 13 measures the distance, and transfers an actually measured distance code Ya to the CPU 11. The CPU 11 selects a data block in the EEPROM 18 including the actually measured distance code per se in accordance with the value of the actually measured distance code Ya and checks the parity of data in the block. If the parity value is an odd number, there causes some abnormality in the data. Therefore, the device displays the abnormality to a display means 19, and reads the distance recommendation value of the block from the ROM 12 and determines it as the distance L based on which the device drives the picture-taking lens.

Figure 4:
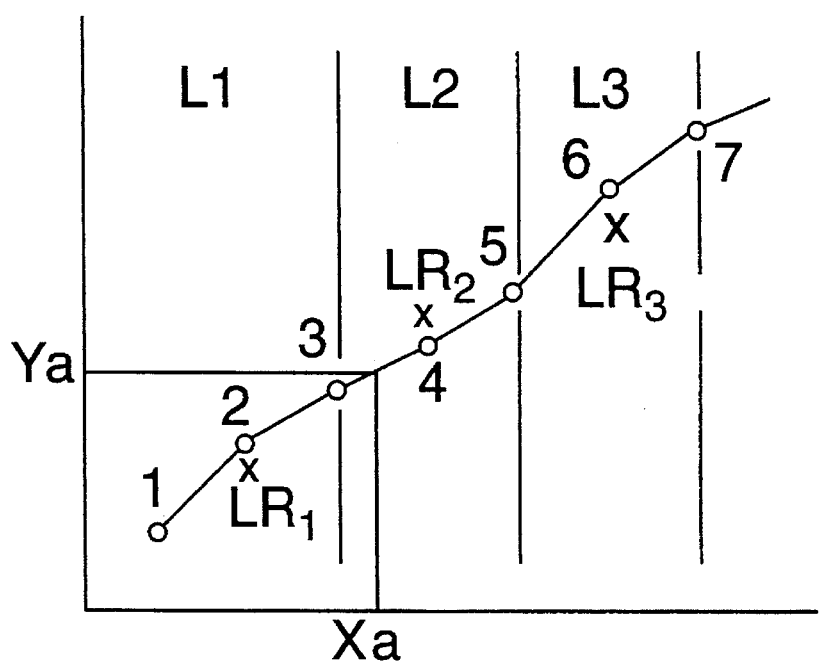
FIG. 4 is a diagram showing a method of an interpolation calculation of the example of the present invention.

If the data are determined to be normal, the device selects addresses containing the actually measured distance codes Yp and Yq and the distance design codes Xp and Xq corresponding to the actually measured distance codes before and after the actually measured distance code Ya in the EEPROM 18. As shown in FIG. 4, in this case, the measured value Ya is in a relationship of Y3<Ya<Y4 and therefore, P=3 and Q=4. Further, the distance design code Xa is calculated by using the equation (1). The distance L is calculated by referring the calculated design code Xa to the distance table DT shown in FIG. 3 and memorized in the ROM 12. The CPU 11 transmits the driving signal in accordance with the distance L to the driving circuit 17, and has a picture-taking lens, not shown, focus on an object by driving it, thereby performing the picture taking.

Figure 5:
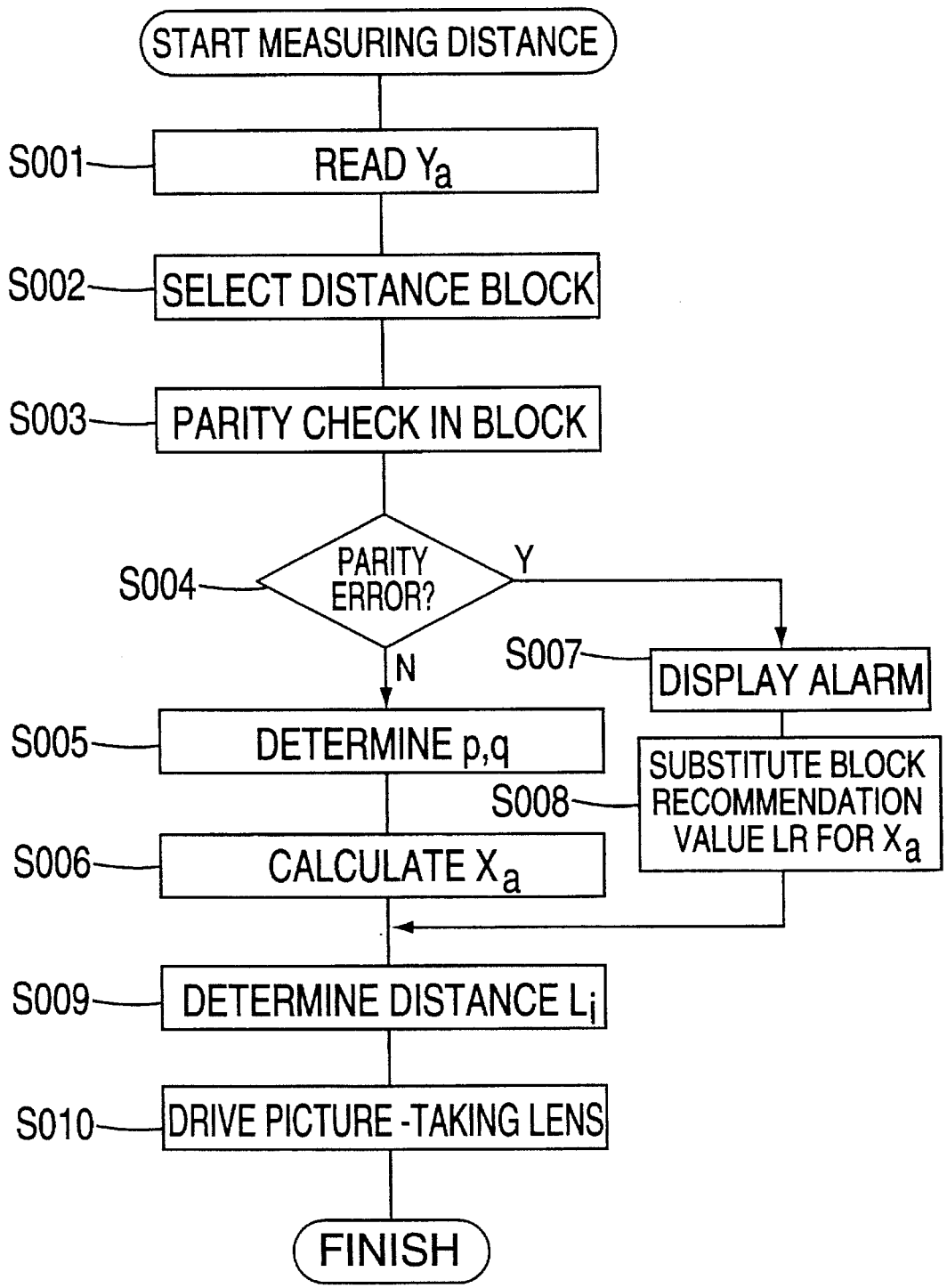
FIG. 5 is a flow chart of the example of the present invention.

The above explanation is shown by a flow chart of FIG. 5. First, a photographer pushes on the release switch and then this routine is entered. The distance measuring means 13 measures the distance in accordance with an order from CPU 11 and transfers the actually measured distance code Ya to the CPU 11 (S001). The CPU 11 selects a data block in the EEPROM 18 containing the actually measured distance code Ya in accordance with the value of the actually measured distance code Ya (S002), and checks the parity of data in the block (S003), and determines whether all the data in the block are in the even number parity (S004). When all the data are in the even number parity, the CPU 11 regards that the data are normal, selects actually measured distance codes Yp and Yq before and after the actually measured distance code Ya in the EEPROM 18 and determined p and q (S005). Further, the CPU 11 calculates the distance design code Xa by substituting p and q into the equation (1) (S006). On the contrary, when data in the odd number parity are obtained in the block, the CPU 11 displays the abnormality of data to the display means 19, and issues an alarm to the photographer (S007), reads the distance recommendation value of the block from the ROM 12 and determines it as the distance design code Xa (S008).

The CPU 11 calculates the distance L by referring the calculated distance design code Xa to the distance table DT of FIG. 3 which has been memorized in the ROM 12 (S009), transmits the driving signal in accordance with the distance L to the driving circuit 17 and has a picture-taking lens (not shown), focus on an object (S010), thereby finishing the routine.

Figure 6:
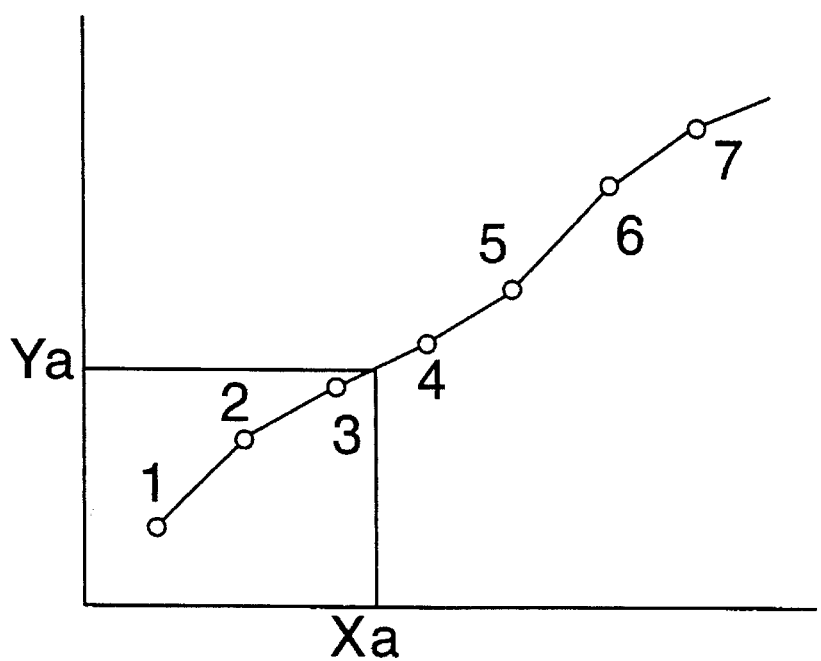
FIG. 6 is a diagram showing a method of an interpolation calculation of another example of the present invention.

In the above example, the amount of driving the picture-taking lens is calculated by using the data in the ROM when the data in the EEPROM are destructed. However, an explanation will be given of a method of calculating the amount of driving by an interpolation of other normal data without using the ROM as a second example based on FIG. 6.

In the second example, the distance measuring means 13 transfers the actually measured distance code Ya to the CPU 11 after finishing the distance measuring, the parity check of the all the data in the EEPROM 18 is performed. When data the number of which is not less than a predetermined number are abnormal, a later exposure operation is prohibited, the device displays an alarm to the display means 19 and informs an photographer that the picture taking is impossible, thereby finishing the routine. Next, the device selects two normal data most proximate to the actually measured distance code Ya, and calculates the distance design code Xa from these two data by an approximation calculation. There may be cases of an interpolation and an extrapolation in the approximation calculation in view of a positional relationship between the actually measured distance code Ya and the selected data. The CPU 11 transmits the driving signal in accordance with the distance design code Xa to the driving circuit 17, and has a picture-taking lens, not shown, focus on an object by driving it, thereby finishing the routine.

Figure 7:
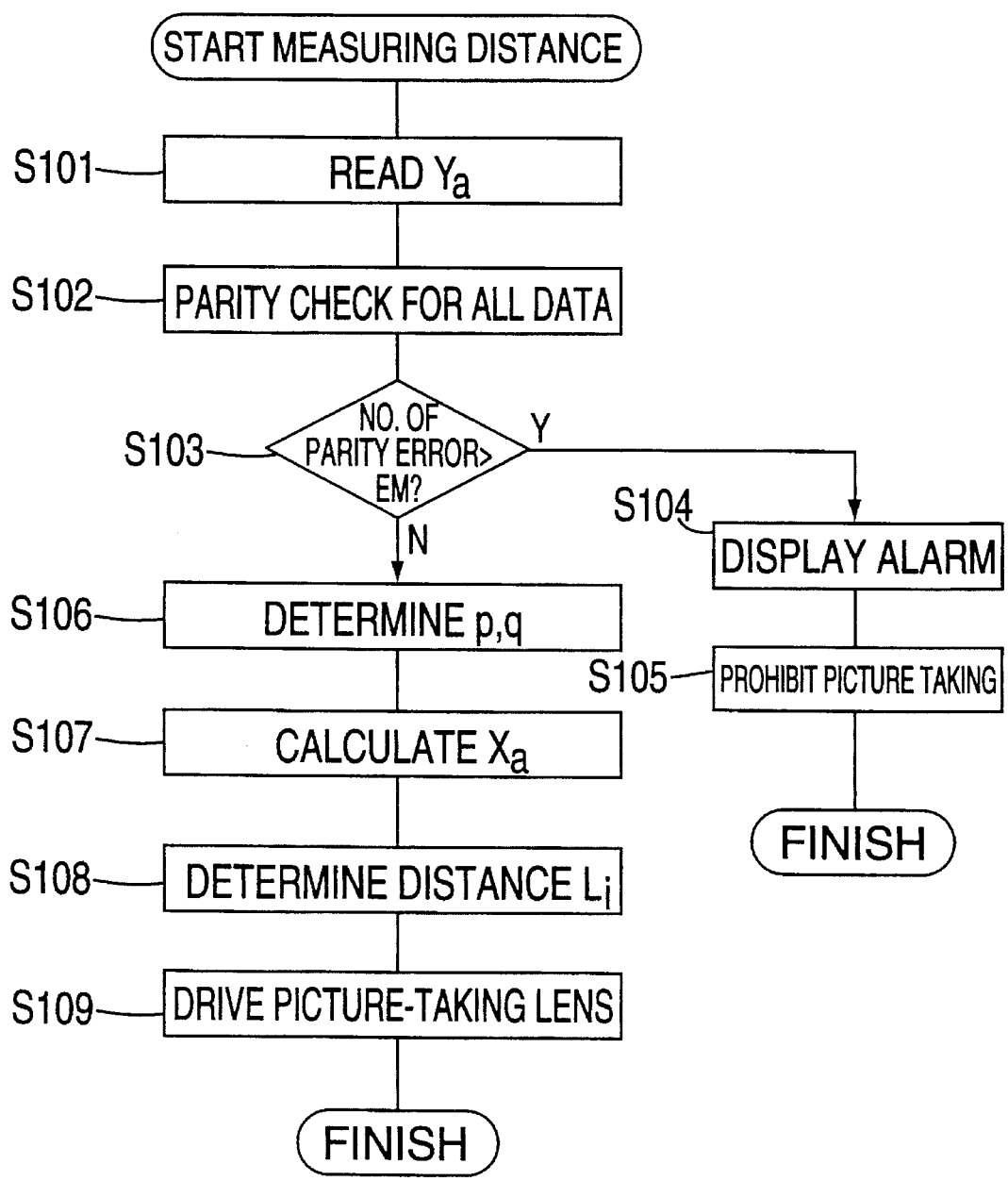
FIG. 7 is a flow chart of the other example of the present invention.

The above explanation is shown in a flow chart of FIG. 7. When a release switch, not shown, is pushed on, the distance measuring means 13 measures the distance in accordance with an order from the CPU 11 and transfers the actually measured distance code Ya to the CPU 11 (S101). Next, the device performs the parity check on all data in the EEPROM 18 (S102) and compares the number of parity error with a predetermined value Em (S103). When, as a result, the number of abnormal data exceeds a predetermined value Em, the device displays an alarm on the display means 19, informs an photographer that the picture taking is impossible (S104), and prohibits a later exposure operation (S105), thereby finishing the routine. When the number of abnormal data is not larger than the predetermined value Em, the device determines p and q from the actually measured distance code Ya (S106), calculates the distance design code Xa by substituting these into the equation (1) (S107), and calculates the distance L by referring it to the distance table DT of FIG. 3 (S108), the CPU 11 transmits the driving signal in accordance with the distance L to the driving circuit 17, and has a picture-taking lens, not shown, focus on an object by driving it (S109), thereby finishing the routine.

Further, although the explanation has been given to the case of measuring the distance in the above examples, this invention is not restricted to the above examples and may be used in correction of exposure, correction of lens characteristic and correction of a transformation error concerning an electric or mechanical system transformation.

Further, in the above examples, the explanation has been given to the method of determining data with respect to the parity check. However, this invention is not restricted to the above examples and other determining means such as a sum check or the like may be employed.

Further, in the above examples, the method of approximation calculation uses a first order approximation. However, other method may be employed without restricting thereto.

According to the construction of the present invention, when the data memorized in the EEPROM are destructed by an unexpected accident such as static electricity, the data are prevented from using, and the picture taking can be continued without applying a serious influence on the picture taking by performing the approximation calculation by using the data memorized in the ROM.

What is claimed is:

1. A data processing device for a camera wherein data are predetermined with respect to a measured value input from a distance measuring means which can express an error amount of the measured value by one and other coordinate axes of an orthogonal coordinate axes system and a correct measured value is provided by a correction calculation using the first data comprising:

a first memorizing means for dividing the first data in a plurality of blocks and memorizing the data;

a second memorizing means for memorizing second data which are different from the first data based on the respective blocks of the first memorizing means;

a determining means for determining whether the first data of one of the blocks related to the measured value inputted from the distance memorizing means are valid or invalid and for outputting a result; and a control means for determining distance data by performing the correction calculation based on the first data related to the measured value in one of the blocks when the first data read from the first memorizing means are determined to be valid, and for determining distance data based on the second data of one of the blocks related to the measured value from the second memorizing means when the first data read from the first memorizing means are determined to be invalid.

2. A data processing device for a camera wherein a plurality of first data are predetermined with respect to a measured value input from outside which can express an error amount of the measured value by one and other coordinate axis of an orthogonal coordinate axis system, and a correct measured value is provided by a correction calculation using the data comprising:

a first memorizing means for memorizing the plurality of data;

a second memorizing means for memorizing second data which are different from the first data and are based on the first data of the first memorizing means;

a determining means for determining whether first data read from the first memorizing means are valid or invalid; and a calculating means for performing the correction calculation by using the first data when the first data is determined to be valid and for performing the correction calculation by using second data when the first data is determined to be invalid wherein the second data differs from the first data read from the first memorizing means.

3. The data processing device for a camera according to claim 2, wherein at least one of prohibiting of releasing the camera and alarming is performed when the first data a number of which is not less than a predetermined number in the first memorizing means are determined to be invalid by the determining means.

4. The device of claim 2 wherein the determining means outputs a result of the determination.

5. A data processing device for a camera which performs a correction calculation using first data, which is predetermined with respect to a measured value input from a distance measuring means, the data processing device comprising:

- a first memorizing means for recording the first data within a plurality of blocks;
- a second memorizing means for recording second data, which are derived from the first data within respective blocks of the first memorizing means, but which differ from the first data;
- a determining means for determining whether the first data of one of the blocks is valid or invalid; and
- a control means for determining distance data by performing a correction calculation based on the first data in one of the blocks of the first memorizing means when the first data is determined to be valid, and for determining distance data based on the second data when the first data is determined to be invalid.

6. The device of claim 5 wherein the determining means outputs a result of the determination.

7. The device of claim 5 further comprising a display means for expressing an error in the measured value in terms of an orthogonal coordinate axis system.

* * * * *